United States Patent
Suzuki

[11] 4,054,386
[45] Oct. 18, 1977

[54] APPARATUS FOR DETERMINING MUTUAL POSITIONAL RELATIONSHIP OF PLURAL PATTERNS IN A SINGLE VIEWING FIELD

[75] Inventor: Akiyoshi Suzuki, Tokyo, Japan

[73] Assignee: Canon Kabushiki Kaisha, Tokyo, Japan

[21] Appl. No.: 704,826

[22] Filed: July 13, 1976

[30] Foreign Application Priority Data

July 17, 1975 Japan .................................. 50-87555

[51] Int. Cl.$^2$ .............................................. G01B 11/26
[52] U.S. Cl. ..................................... 356/153; 356/171; 356/172
[58] Field of Search ................ 356/138, 153, 163, 171, 356/172

[56] References Cited

U.S. PATENT DOCUMENTS

| | | | |
|---|---|---|---|
| 3,667,848 | 6/1972 | Percival | 356/153 |
| 3,752,589 | 8/1973 | Kobayashi | 356/171 |

Primary Examiner—John K. Corbin
Assistant Examiner—R. A. Rosenberger
Attorney, Agent, or Firm—Fitzpatrick, Cella, Harper & Scinto

[57] ABSTRACT

The mutual positional relationship of a first pattern and a second pattern in a single viewing field will be determined. A light beam passing through an objective lens is divided by means of a beam splitter into a first light beam advancing along a first optical path and a second light beam advancing along a second optical path. Said first and second light beams are again united by a beam combiner to form, on an image plane, a first image of said first and second patterns formed by said first light beam passing through said first optical path and a second image of said first and second patterns formed by said second light beam passing through said second optical path. In said first optical path there is provided an adjuster for displacing, in said image plane, the first image of said first and second patterns formed by said first light beam. An adjustment is made with said adjuster so as to bring said first image of patterns formed by said first light beam to a predetermined position with respect to the second image of patterns formed by said second light beam, and the amount of such adjustment is determined by an adjustment detector. Thus the positional mutual relationship of said first and second patterns is determined from the thus detected amount of adjustment.

10 Claims, 12 Drawing Figures

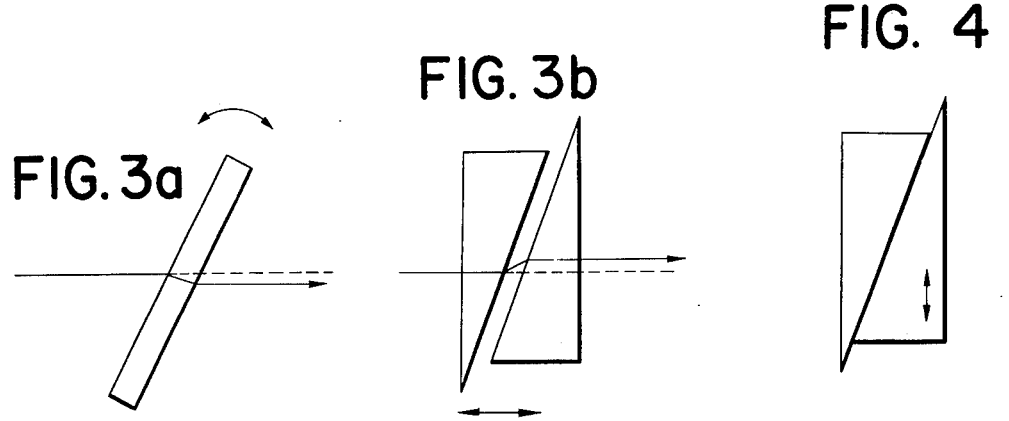
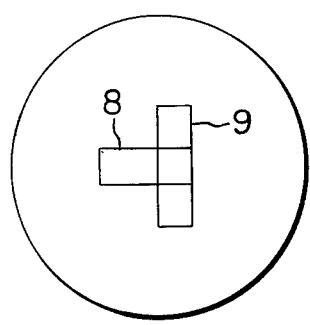
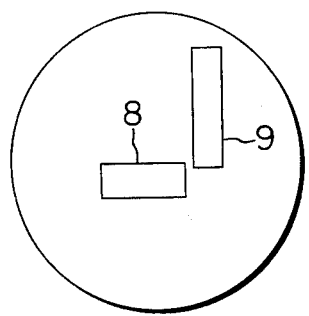
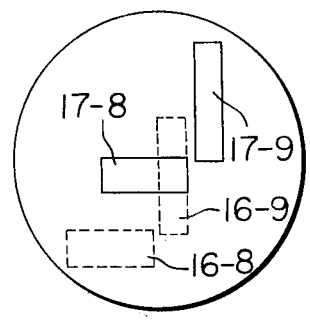
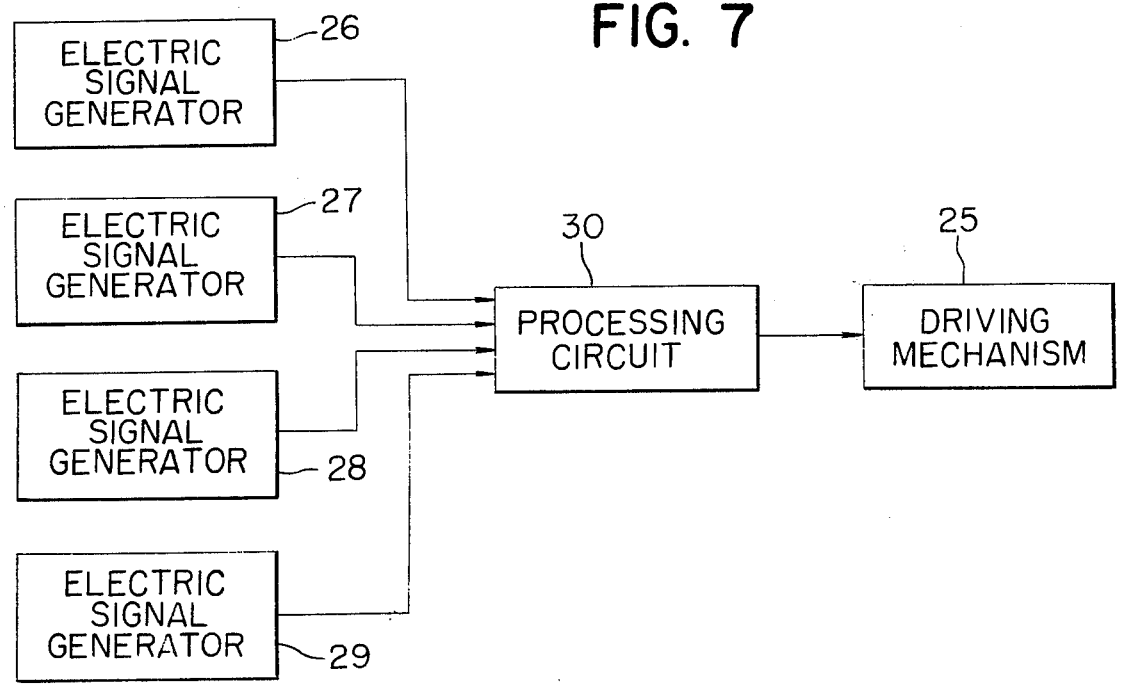

APPARATUS FOR DETERMINING MUTUAL POSITIONAL RELATIONSHIP OF PLURAL PATTERNS IN A SINGLE VIEWING FIELD

BACKGROUND OF THE INVENTION

The present invention relates to apparatus for determining the mutual positional relationship of plural patterns present in a single viewing field.

The manufacturing process for semiconductor elements such as transistors or integrated circuits (i.e. IC or LSI) includes the steps of printing of minute patterns and of lead wire bonding, in which a circuit plate or pellet has to be exactly positioned to a predetermined location. As such a circuit plate is provided with a fine structure of micron or sub-micron order, such positioning operation has also to be performed with an accuracy of micron or sub-micron order. Such operation, however, requires a two-dimensional positioning involving three parameters, i.e. two translational components $x$, $y$ and a rotational component $\theta$, and is considerably cumbersome for the operator, requiring considerable time to acquire the expertise.

For example, in integrated circuit printing, the relative positional adjustment of a mask and a wafer is usually performed by an observation of the patterns to be aligned under a microscope and by displacing manually either said mask or wafer. The positioning or alignment is usually achieved by the observation of mutual positions of patterns in plural spots in order to enable two-demensional alignment.

However, in an alignment operation with observation of patterns in two spots, for example, at left and at right, the aligning procedure is complicated by a phenomenon that the alignment at the right spot cannot be obtained if the alignment is achieved at the left spot alone, or vice versa. In order to facilitate such aligning procedure there has recently been proposed so-called automatic aligning equipment in which the aligning operation is performed by photoelectrically detecting the determined patterns previously formed on the mask and wafer.

SUMMARY OF THE INVENTION

The object of the present invention is to provide apparatus for determining the mutual positional relationship of plural patterns, which is indispensable for achieving the above-mentioned alignment.

In the above-mentioned apparatus a light beam containing information of plural patterns and passing through an imaging optical system is divided by means of a beam splitter into two light beams which, after passing through mutually partly different optical paths, are again united. An image of said patterns thus formed on an image plane is displaced to a position determined with respect to the other image by means of an adjusting means provided in at least either one of said different optical paths, and the mutual positional relationship of said plural patterns is determined from the amount of adjustment required for such displacement.

Furthermore the apparatus of the present invention provided with the aforementioned optical system in plural units is capable of detecting the mutual positional relationship of said plural patterns in plural spots and thus determining the two-dimensional positional relationship. For example, in the aligning procedure of a mask and a wafer, it is rendered possible to the mutual positional displacement between the wafer and mask in plural spots on the mask. In contrast to the conventional procedure wherein the aligning is performed by directly displacing either the mask or wafer, in the apparatus of the present invention the wafer and mask are maintained in the original unaligned state, and the mutual positional aberration between the mask and wafer in said state is determined in plural spots by means of the adjusting means in said optical systems. The apparatus of the present invention is free from the above-mentioned inconvenience that the alignment at the right spot is not obtained when the alignment is made at the left spot and vice versa, since the adjustment is solely made by the optical system while the mask and wafer remain immobile. Also the adjustment operation is greatly facilitated as it can be independently carried out at the left and right spots. It is further possible to the mutual aberration between the mask and wafer by means of a drive mechanism which received, as input electrical signals, said aberrations in plural spots determined by the amounts of adjustment of said adjusting means and performs correcting displacements accordingly.

Now the apparatus of the present invention will be explained in detail with respect to an embodiment in an aligning device for the mask and wafer for an integrated circuit.

BRIEF DESCRIPTION OF THE DRAWINGS

FIGS. 3(a) and 3(b) show the examples of image displacing means;

FIG. 4 shows elements for compensating the optical path length;

FIG. 5 shows an example of an ideal arrangement of patterns to be aligned;

FIGS. 6(a) and 6(b) show explanatorily the procedure of adjustment;

FIG. 7 is a block diagram of the electric circuit;

DESCRIPTION OF THE PREFERRED EMBODIMENTS

Figure 1:
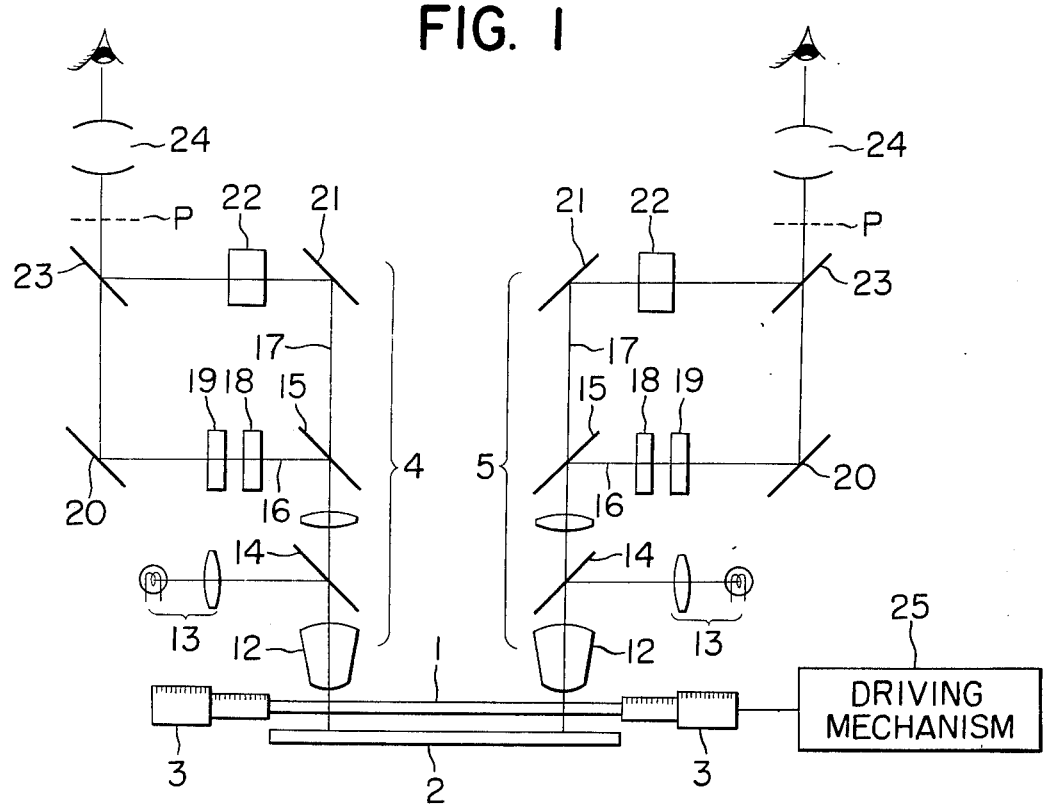
FIG. 1 is a schematic diagram of a printing machine utilizing the apparatus of the present invention.

Now referring to FIG. 1 there is shown an embodiment wherein the apparatus of the present invention is applied to a contact or proximity printing machine and wherein a part particularly related to the apparatus of the present invention is schematically illustrated while the remaining part of the machine, for example, printing system is already known in the prior art and is therefore omitted in the illustration. Numeral 1 designates a mask, 2 a wafer arranged with a determined spacing, for example, of several tens of microns from mask 1, and 3 supporting members for holding mask 1 for parallel and rotational transfer with respect to wafer 2. The supporting members 3 may also be provided on wafer 2. The aligning procedure may be carried out on the alignment marks specifically provided in the patterns of the mask and wafer, or on a part of the patterns constituting the integrated circuit.

Figure 2:
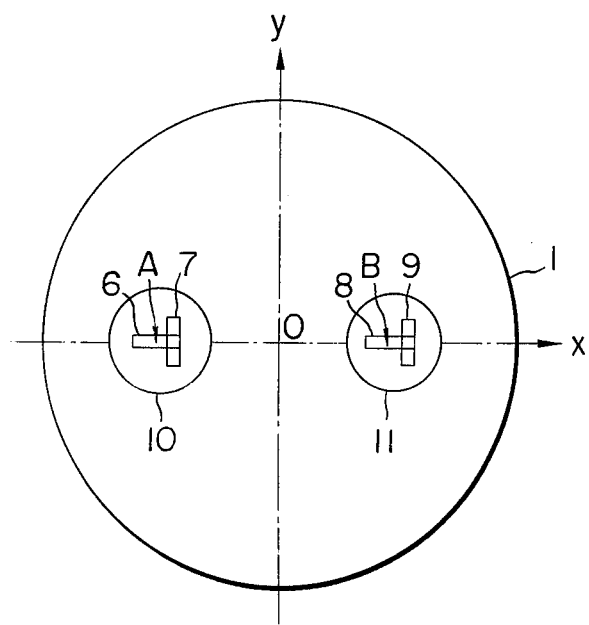
FIG. 2 is a view showing the positions of observed areas in the wafer in FIG. 1.

Numerals 4 and 5 designate optical systems for observing the patterns on the mask and wafer, for example respectively in the spots or areas 10, 11 as shown in FIG. 2. The areas 10, 11 are selected in the positions of specific alignment marks if such marks are present or in the parts of circuits where easily identifiable patterns are present. Also in case the measurements are to be carried out in two areas, it is advantageous to select areas 10 and 11 in such a manner that the line connecting areas 10 and 11 passes through the rotational center 0 or the proximity thereof. In the present example it is assumed that circuit patterns 6, 7, 8 and 9 are observable in the areas 10 and 11. Among patterns 6 and 8 are patterns on the mask while 7 and 9 are those present on the wafer. The optical system 4 and 5 for observation are displaced aside at the printing operation.

Further referring to FIG. 1, numeral 12 indicates a microscope objective lens, 13 an illuminating optical system, 14 a half mirror for guiding the light from said illuminating system 13 to the observation system, and 15 a half mirror for splitting the light beam from objective lens 12 into two light beams in the optical paths 16 and 17.

In the optical path 16 there are provided adjusting members 18 and 19, of which the member 18 performs a function of displacement in x-direction of the image of mask 1 and wafer 2 formed on a primary image plane P through optical path 16, while the member 19 performs a function of displacement thereof in y-direction. Two examples of such members are illustrated in FIG. 3(a) and (b). That member may be composed of a flat plate with parallel surfaces as shown in FIG. 3(a) or two prism blocks as shown in FIG. 3(b), which both are capable of causing a parallel transfer in the transmitted light with respect to the incident light by a rotation or a displacement as shown by the arrows in the drawings. Further, though the adjusting members 18 and 19 are provided separate in FIG. 1, those members may be replaced by a mechanism which can perform adjustment both in the x- and y-directions, for example a flat plate with parallel surfaces which can be twisted in any desired direction. Furthermore it is possible to provide an adjusting member for x-direction and an adjusting member for y- direction respectively in the optical paths 16 and 17, or to provide the adjusting members for x- and y-directions both in the optical paths 16 and 17. In the embodiment shown in FIG. 1, the adjusting members are provided only in the optical path 16, while the optical path only contains a glass block 22 for compensating the optical path length. It is further possible to modify the position of primary focal plane P of the mask 1 and wafer 2 by changing the thickness of glass block 22. In the arrangement shown in FIG. 1, the images of the mask 1 and wafer 2 are focussed, due to a certain distance therebetween, on different planes, and it is desirable that, on the assumed primary focal plane P, there is focussed an image of the mask 1 through the optical path 16 and also focussed is an image of the wafer through the optical path 17, or vice versa. According to the principle of the present invention an image of mask formed through an optical path is aligned with an image of the wafer formed through the other optical path, and an elevated accuracy can be expected if both images to be aligned can be correctly focussed. In the projection printing method wherein the mask and wafer can be considered involved essentially in the same plane, the glass block 22 can be constructed simply to equalize the length of optical path 17 with that of optical path 16. In a contact or proximity printing method wherein the mask and wafer are mutually separated, by a certain distance, the glass block 22 may be structured adjustable in thickness according to said distance, as shown in FIG. 4. In this case the lateral displacement of the image can be made negligibly small if either one prism is fixed. Numeral 23 denotes a half mirror for superposing the light beams from the optical paths 16 and 17, and guiding the thus combined light beam to an eyepiece 24. Numeral 25 indicates a known drive mechanism for performing parallel transfer of mask supporting members 3 in x- and y-directions and rotational transfer in $\theta$-direction, and is controlled by an electric control circuit. Although the embodiment shown in FIG. 1 utilizes two separate eyepieces used respectively for the optical systems 4 and 5, it is also possible to replace these with a single eyepiece by combining the images in an already known manner.

Now the aligning procedure in the above-mentioned apparatus will be described in detail while referring to FIGS. 6 and 7. As said procedure is applicable in an identical manner both to the optical systems 4 and 5, the following explanation will be made, for simplicity, on the area 11 observed under the system 5. The patterns observed in the area 11 consists of a pattern 8 present on the mask and a pattern 9 present on the wafer. It is now assumed that those patterns are a part of actual integrated circuit and that the patterns are to be arranged in a mutual relationship as shown in FIG. 5 for the purpose of integrated circuit manufacture. The mask 1 and wafer 2 are previously aligned to a certain degree by a pre-aligning operation, but in this state the positional relationship as shown in FIG. 5 is naturally not achieved. It is therefore assumed that the initial state of area 11 is as shown in FIG. 6(a), in which the patterns 8 and 9 are evidently not in the desired mutual relationship. It is further assumed that the images formed through the optical path 16 (the images of mask and wafer being respectively referred to as 16-8 and 16-9) are completely superposed with the images formed through the optical path 17 (the images of mask and wafer being respectively referred to as 17-8 and 17-9). Such a situation can be easily achieved by, for example in case of a flat plate with parallel surfaces shown in FIG. 3(a), placing said plate in a position perpendicular to the optical axis. Consequently the pattern 8 in FIG. 6(a) is superposed double images 16-8 and 17-8, and the pattern 8 is superposed double images 16-9 and 17-9. In this state by regulating the adjusting members present in the optical path 16, for example by rotating the flat plate or changing the distance of prism blocks, the images 16-8 and 16-9 formed through the optical path 16 are displaced with respect to the images 17-8 and 17-9 formed through the optical path 17. This adjustment is continued until the image 17-8 and image 16-9 reach a mutual relationship as shown in FIG. 6(b) which is identical to that of patterns 8 and 9 in FIG. 5. It is also possible to conduct a similar adjustment procedure for the images 17-9 and 16-8. According to the present invention the mutual positional relationship of the mask and wafer is determined by detecting the amount of adjustment performed by adjusting members 18 and 19 through an adjustment detecting device such as an encoder.

For the two-dimensional alignment of the mask and wafer, the above-mentioned detection of positional aberration is conducted in at least two areas, by means of optical observation systems 4 and 5 as shown in FIG. 1. The amounts of adjustments of the adjusting members 18 and 19 are processed in a processing circuit as shown in FIG. 7 for controlling the drive mechanism 25. Referring to FIG. 7, numerals 26 and 27 designate signal generators for generating electrical signals corresponding to the amounts of adjustments performed by the adjusting members 18 and 19 in the optical system 4, while numerals 28 and 29 denote signal generators for generating electrical signals corresponding to the amounts of adjustments performed by the adjusting memers 18 and 19 in the optical system 5, and the signals from generators 26, 27, 28 and 29 are processed in a processing circuit 30 to determine the parallel aberrations $\alpha x$ and $\alpha y$, and rotational aberration $\alpha \theta$ between the mask and wafer.

For simplicity there is now assumed a case wherein the centers of measurement A and B are located symmetrically with respect to the rotational center 0 as shown in FIG. 2 and the length of 0A or 0B is equal to r. Supposing that the vectors of the positional aberration between the mask and wafer are:

$$\vec{x}^A = (x_1, y_1)$$

$$\vec{x}^B = (x_2, y_2),$$

then the aberrations $\Delta x$, $\Delta y$ and $\Delta \theta$ can be determined by the following equations:

$$\Delta x = (x_1 + x_2)/2$$

$$\Delta y = (y_1 + y_2)/2$$

$$\Delta \theta = \arcsin(y_2 - y_1/2r).$$

Thus the alignment of the mask 1 and wafer 2 can be achieved by controlling the drive mechanism 25 according to the above-obtained values. The procedure thus far explained is extremely easy for the operator since the mask and wafer are not directly displaced as in the conventional procedure, and is extremely effective in that the operator is relieved from the trouble of controlling three parameters x, y and $\theta$ since an electric system performs the necessary calculation and the control of drive mechanism once the double images are aligned in a manner as explained in the foregoing, and is furthermore advantageous in that special alignment marks do not need to be provided. However such alignment marks provide an advantage of improved accuracy in the calculation of said values $\Delta x$, $\Delta y$ and $\Delta \theta$, and should therefore be adopted adequately in consideration of the characteristics of the component parts and the size of the pattern of a integrated circuit. Also the precision of measurement can be improved by placing filters of different colors in the optical paths thereby enabling indentification of the images of different optical paths.

Figure 8:
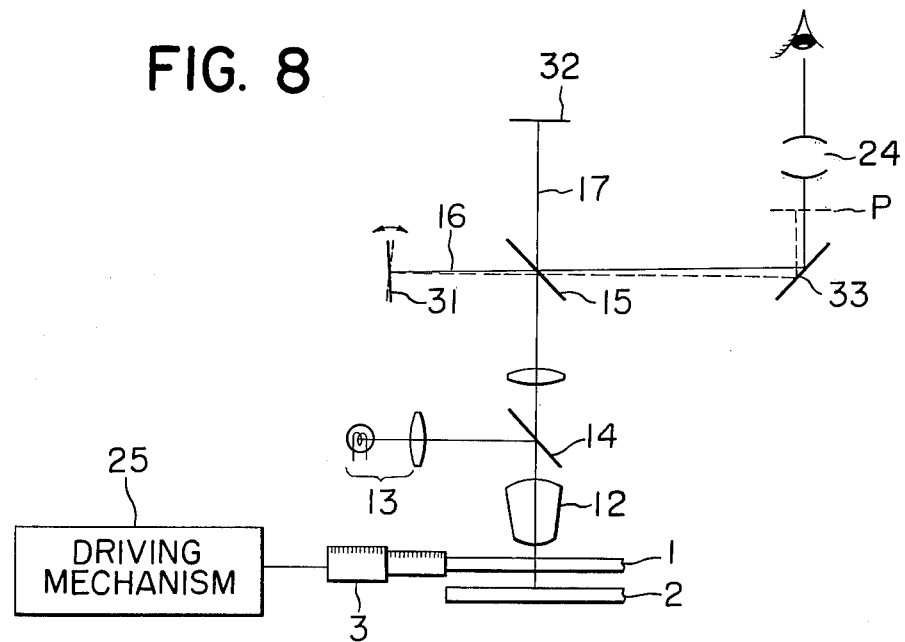
FIG. 8 shows another embodiment wherein the apparatus of the present invention is applied to an another printing machine.

FIG. 8 shows an optical observation system of a structure different from that in FIG. 1, in which a light beam 16 split by a half mirror 15 is directed to an adjusting member 31 consisting of a mirror rotatable laterally and vertically in the illustration. It is also possible to place an optical block 22 for compensating the optical path length for example in the optical path 17 in order to achieve correction on the focal position of the mask and wafer, though such a block 22 is not shown in the illustration. The mirror 31 is capable, when inclined, of performing a displacement, on the primary image plane P, of image formed through the optical path 16. Thus the amounts to be detected are represented by the direction and amount of inclination of said mirror. Numerals 32 and 33 denote mirrors for guiding the light beam toward an eyepiece 24.

Figure 9:
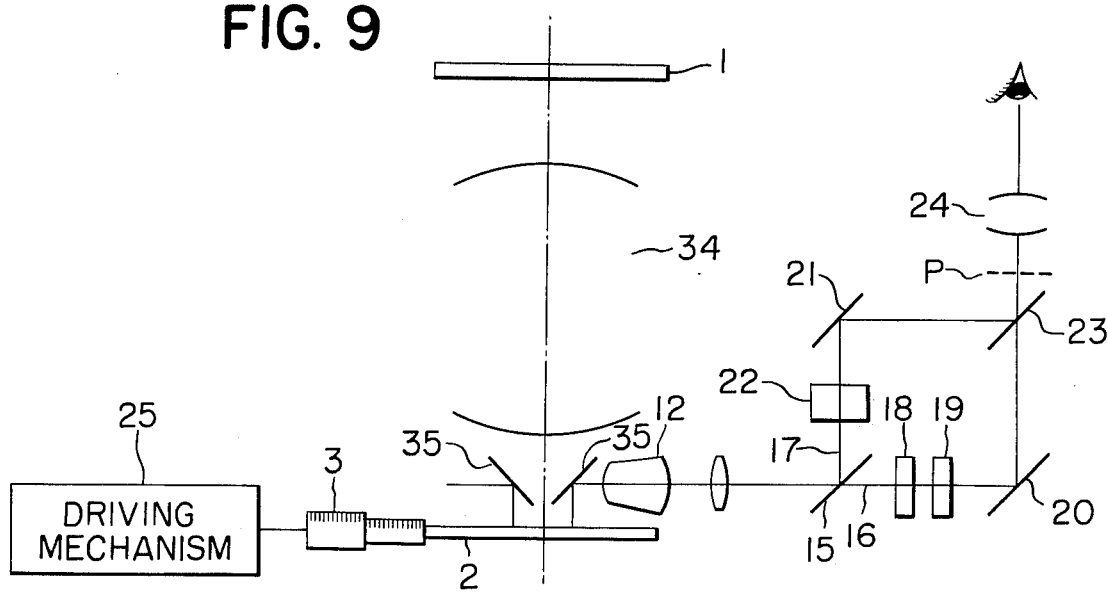
FIGS. 9 and 10 show still another applications of the present invention.
Figure 10:
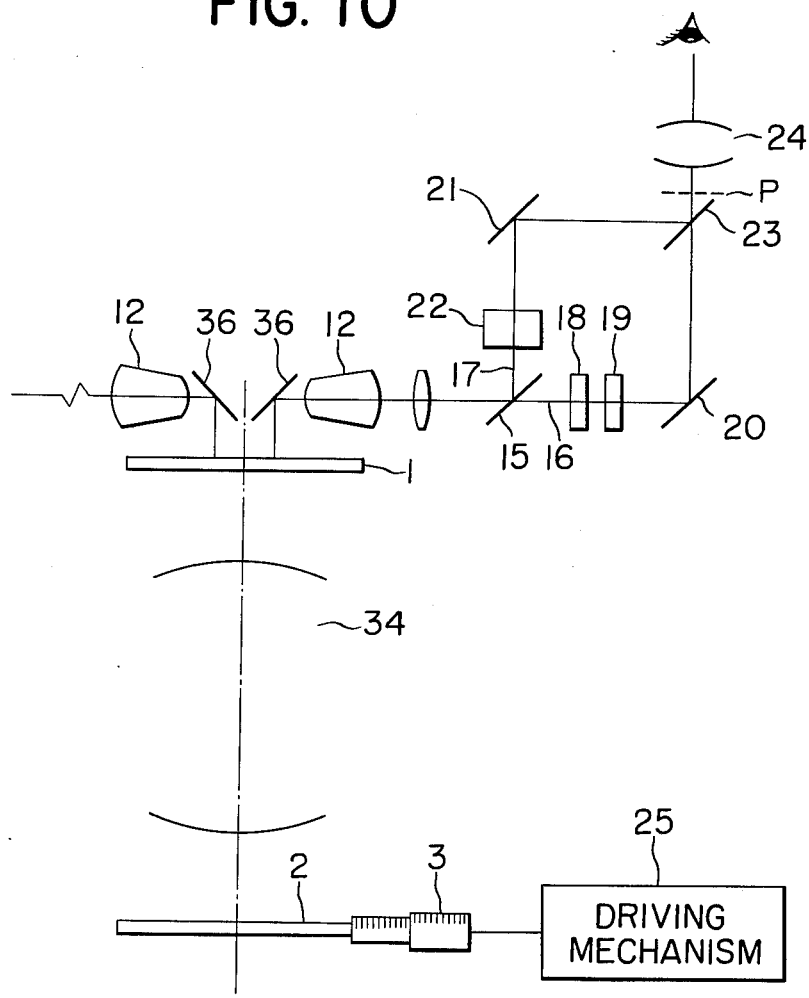

In contrast to the foregoing embodiments in which the apparatus of the present invention is applied in printing machines of proximity method or contact method, FIGS. 9 and 10 show the embodiments wherein the apparatus of the present invention is applied in the printing by projection method. These embodiments are different from the case of FIG. 1 in that the mask 1 and/or wafer 2 are composed of optical image(s) and that the mask or image thereof lies in the same plane as the wafer or the image thereof, thus providing an advantage that the images of the mask and wafer can both be sharply focused on the primary focal plane P. Numeral 34 designates a projection optical system, 35 a half mirror, 36 a half mirror or a mirror, depending upon the method of illumination. It is also possible to observe the mask directly with the objective lens without said mirror 35 or to place said mirror 35 between the mask 1 and the optical system 34, but such methods are already publicly known and are therefore not explained in detail. The optical system after the objective lens is identical to that in FIG. 1. The present invention is featured by the structure after the light beam is introduced to the alignment optics, and is therefore not affected by the method of illuminating and observing the mask and wafer. Furthermore it is naturally possible to apply, in the structures of FIG. 9 or 10, an optical system other than that of FIG. 1, for example the optical system shown in FIG. 8.

As explained in the foregoing, the method of the present invention is unique in that the mutual positional relationship of two patterns can be measured by optical displacement of images, and in that a two-dimensional alignment of patterns is facilitated by conducting measurements in two areas. Furthermore the method of the present invention is not only applicable in the alignment but also utilizable in determining positional relationship of various patterns or measuring the periodicity of repeating patterns.

What is claimed is:

1. An apparatus for detecting mutual positional relationship of a first pattern and a second pattern present in a single viewing field, comprising:

an objective lens of which viewing field contains the first and second patterns of which mutual positional relationship is to be determined;

a beam splitter member provided between said objective lens and an image focusing plane for splitting a light beam containing information of the first and second patterns into a first light beam and a second light beam respectively advancing along first and second optical paths;

a beam recombiner for reuniting the first and second light beams and thus forming on the image focusing plane a first image of the first and second patterns by the first light beam passing along the first optical path and a second image of the first and second patterns by the second light beam passing along the second optical path;

image displacing means provided at least in one of the first and second optical paths for mutually displacing the second image of the first and second patterns formed by the second light beam passing through the second optical path with respect to the first image of the first and second patterns formed by the first light beam passing through the first optical path so as to bring the second image to a position predetermined with respect to the first image; and means for detecting the amount of displacement performed by said image displacing means, the mutual positional relationship between the first and second patterns being determinable from the amount of the displacement.

2. An apparatus according to claim 1 further comprising:
a color filter provided at least in one of the first and second optical paths.

3. An apparatus according to claim 1 wherein the first and second patterns are respectively included in first and second substrates positioned with a certain distance maintained therebetween on the optical axis of said objective lens.

4. An apparatus according to claim 3 comprising:
optical path length compensating means provided at least in one of the first and second optical paths for compensating the difference in optical path length resulting from the certain distance.

5. An apparatus according to claim 3 wherein at least one of said first and second substrates is supported by a supporting mechanism allowed to be displaced in parallel with the other.

6. An apparatus according to claim 5 wherein said supporting mechanism is driven by a drive mechanism which is controlled by an electric controller generating electric signals in response to the amount of the displacement performed by said image displacing means.

7. An apparatus for detecting mutual positional relationship between a first pattern and a second pattern in a first viewing field and mutual positional relationship between a third pattern and a fourth pattern in a second viewing field, comprising:

a first objective lens covering a first viewing field containing the first and second patterns of which mutual positional relationship is to be determined;

a first beam splitting member provided between said first objective lens and a first image focusing plane for splitting a light beam containing information of the first and second patterns into a first light beam and a second light beam respectively advancing along first and second optical paths;

a first beam recombiner for reuniting the first and second light beams and thus forming on the first image focusing plane a first image of the first and second patterns by the first light beam passing along the first optical path and a second image of the first and second patterns by the second light beam passing along the second optical path;

first image displacing means provided at least in one of the first and second optical paths for mutually displacing the second image of the first and second patterns formed by the second light beam passing through the second optical path with respect to the first image of the first and second patterns formed by the first light beam passing through the first optical path so as to bring the second image to a position predetermined with respect to the first image;

first detecting means for detecting the amount of displacement performed by said first image displacing means, whereby the mutual positional relationship between the first and second patterns is determinable from the amount of the displacement;

a second objective lens covering a second viewing field containing the third and fourth patterns of which mutual positional relationship is to be determined;

a second beam splitting member provided between said second objective lens and a second image focusing plane for splitting a light beam containing information of the third and fourth patterns into a third light beam and a fourth light beam respectively advancing along third and fourth optical paths;

a second beam recombiner for reuniting the third and fourth light beams and thus forming on the second image focusing plane a third image of the third and fourth patterns by the third light beam passing along the third optical path and a fourth image of the third and fourth patterns by the fourth light beam passing along the fourth optical path;

second image displacing means provided at least in one of the third and fourth optical paths for mutually displacing the fourth image of the third and fourth patterns formed by the fourth light beam passing through the fourth optical path with respect to the third image of the third and fourth patterns formed by the third light beam passing through the third optical path so as to bring the fourth image to a position predetermined with respect to the third image; and second detecting means for detecting the amount of displacement performed by said second image displacing means, whereby the mutual positional relationship between the third and fourth patterns is determinable from the amount of the displacement.

8. An apparatus according to claim 7 wherein the first and third patterns are provided on a first substrate while the second and fourth patterns are provided on a second substrate.

9. An apparatus according to claim 8 wherein at least one of said first and second substrates is supported by a supporting mechanism allowed to be displaced in parallel with the other.

10. An apparatus according to claim 9 wherein said supporting mechanism is driven by a drive mechanism which is controlled by an electric controller generating control signals in response to the amounts of the displacements performed by said first and second image displacing means.

* * * * *